United States Patent [19]

Raspagliesi et al.

[11] Patent Number: 5,144,143

[45] Date of Patent: Sep. 1, 1992

[54] DEVICE FOR THE IONIZATION OF METALS HAVING A HIGH MELTING POINT, WHICH MAY BE USED ON ION IMPLANTERS OF THE TYPE USING ION SOURCES OF FREEMAN OR SIMILAR TYPE

[75] Inventors: Mario Raspagliesi, San Giovanni La Punta; Candido Medulla, Trecastagni, both of Italy

[73] Assignee: Consorzio per la Ricerca Sulla Microelettronica nel Mezzogiorno, Catania, Italy

[21] Appl. No.: 641,692

[22] Filed: Jan. 16, 1991

[30] Foreign Application Priority Data

Jan. 23, 1990 [IT] Italy ............... 19134 A/90

[51] Int. Cl.$^5$ ............................... H01J 27/00
[52] U.S. Cl. ............................. 250/426; 250/427; 315/111.81
[58] Field of Search ........... 250/425, 426, 427, 492.21; 315/111.81; 313/359.1, 362.1

[56] References Cited

U.S. PATENT DOCUMENTS

| | | | |
|---|---|---|---|
| 3,408,283 | 10/1968 | Chopra et al. | 250/426 |
| 3,409,529 | 11/1968 | Chopra et al. | 250/426 |
| 4,074,139 | 2/1978 | Pankove | 250/492.21 |
| 4,135,094 | 1/1979 | Hull | 250/427 |
| 4,250,009 | 2/1981 | Cuomo et al. | 250/492.21 |
| 4,339,691 | 7/1982 | Morimaya et al. | 250/426 |
| 4,911,814 | 3/1990 | Matsuoka et al. | 315/111.81 |

OTHER PUBLICATIONS

Patent Abstracts of Japan, vol. 13, No. 481 (E-838) (3829) Oct. 31, 1980, & JP-A-01 189 838 (Nissin Electric) Jul. 31, 1989.
Nucl. Instrum. and Meth., vol. 22, 1963, North-Holland, J. H. Freeman: "A New Ion Source for Electromagnetic Isotope Separators".

Primary Examiner—Bruce C. Anderson
Attorney, Agent, or Firm—Griffin, Branigan & Butler

[57] ABSTRACT

The device comprises a cylindrical casing provided with an internal cavity and with a flange and an arc chamber superimposed over the cylindrical casing and including a filament electrically supplied through supply conductors external to said casing and supported by said flange, a repeller plate held at a negative voltage through supply conductors external to said casing and supported by said flange and an inlet for a gas which may be ionized, Inside the arc chamber there is also a support for the metal to be ionized supported and connected electrically to an electrode at a negative voltage by means of a rod passing through the internal cavity of said cylindrical casing.

4 Claims, 2 Drawing Sheets

DEVICE FOR THE IONIZATION OF METALS HAVING A HIGH MELTING POINT, WHICH MAY BE USED ON ION IMPLANTERS OF THE TYPE USING ION SOURCES OF FREEMAN OR SIMILAR TYPE

DESCRIPTION

The present invention relates to a device for the ionization of metals having a high melting point, which may be used on ion implanters of the type using ion sources of Freeman or similar type.

The use is known of Freeman sources inserted in ion implanters for the ionization of metals such as Boron, Phosphorus, Arsenic, Antimony normally used in the semiconductor industry for doping by ion implantation.

Such sources comprise a cylindrical casing provided with an internal cavity and with flanges at the extremities, inside which there is a vaporizer. Over the cylindrical casing there is superimposed an arc chamber provided with a pair of holes for the alternate introduction of a gas, say Argon, supplied by a special feeding tube, or of a gas coming from the vaporizer by sublimation from a solid material, respectively. In the arc chamber there is a tungsten filament which when heated by a current having a high intensity, say 200 A, emits electrons which are then accelerated towards the arc chamber's walls by a voltage applied between the filament and the above walls, equal to about 100 V. Again according to the prior art, there is also present in the arc chamber an electron repeller plate, held at a negative potential, suitable for maintaining the electrons in a central position inside the arc chamber, just above the hole for the introduction of gas into the above chamber.

In such known Freeman sources the gas atoms introduced into the arc chamber are ionized and charged positively by the collision with the electrons emitted by the tungsten filament and in turn, issuing from the arc chamber through an upper aperture of same thanks to a high negative voltage (typically 80 KV) applied between the arc chamber and ground, are finally inplanted into the semiconductor to be doped.

Such known sources have the drawback of not allowing, when they are used in commercial implanters, the ionization of metals having a melting point above 900° C.

For such an application implanters are commonly used which are specifically built to tackle the problem of ion implantation of metals having a high melting point and which in general can only be used for the purpose of scientific research, which implanters, however, are not suitable for ionizing, with an adequate industrial productivity, the elements normally used in the semiconductor industry for ion implantation, such as Boron, Phosphorus, Arsenic, Antimony.

The known Freeman sources can not, on the other hand, be used in these implanters of metals having a high melting point.

The object of the present invention is to accomplish a device for the ionization of metals having a high melting point, which uses the structure of a Freeman type source in a modified form which allows its use in commercial implanters and, at the same time, while maintaining its classical operation, allows it to ionize metals having a high melting point.

According to the invention such object is attained with a device for the ionization of metals having a high melting point, which may be used on ion implanters of the type using ion sources of Freeman or similar type, comprising a cylindrical casing provided with an internal cavity and with a flange and an arc chamber superimposed over the cylindrical casing and including a filament electrically supplied through supply conductors external to said casing and supported by said flange, a repeller plate held at a negative voltage through supply conductors external to said casing and supported by said flange and an inlet for a gas which may be ionized, characterized in that it comprises a support for the metal to be ionized housed inside said arc chamber and supported by and connected electrically to an electrode at a negative voltage by means of a rod passing through the internal cavity of said cylindrical casing.

There is obtained in this way the possibility of ionizing metals, or chemical elements in general, having a high melting point without substantially altering either the structure or the classical operation of the Freeman source, increasing considerably its operational possibilities and, in particular, allowing its assembly, albeit in a modified form, for metals having a high melting point on commercial implanters which normally use this source for the ionization of gases or of metals having a low melting point.

The features of the present invention shall be made more evident by an embodiment illustrated as a non-limiting example in the enclosed drawings, wherein.

Figure 1:
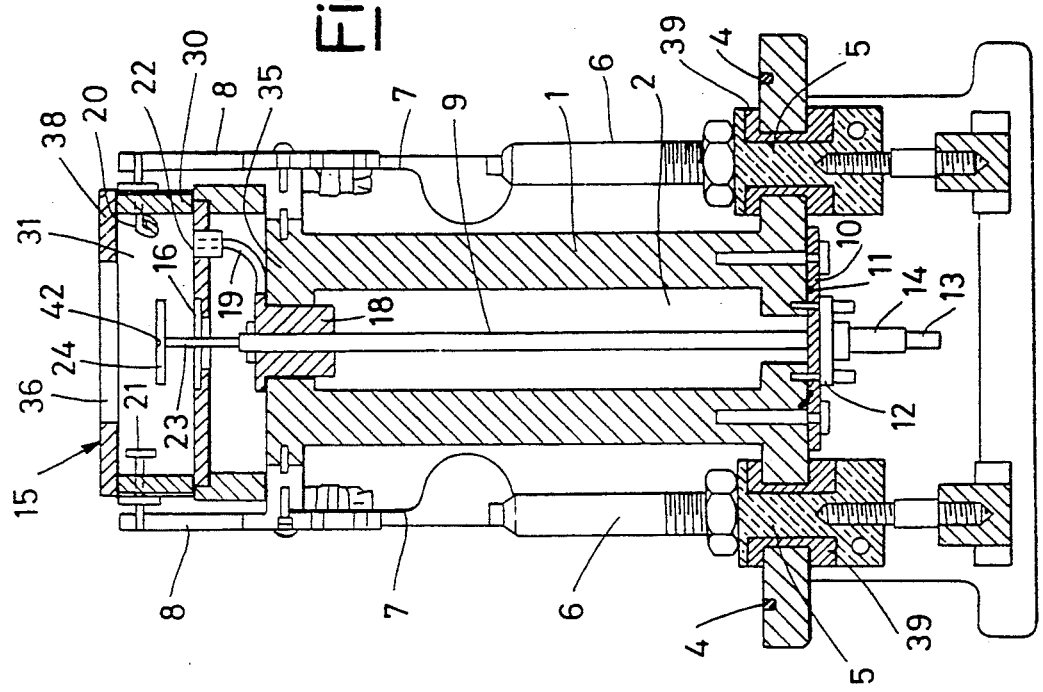
FIG. 1 illustrates a front sectional view of the device.
Figure 2:
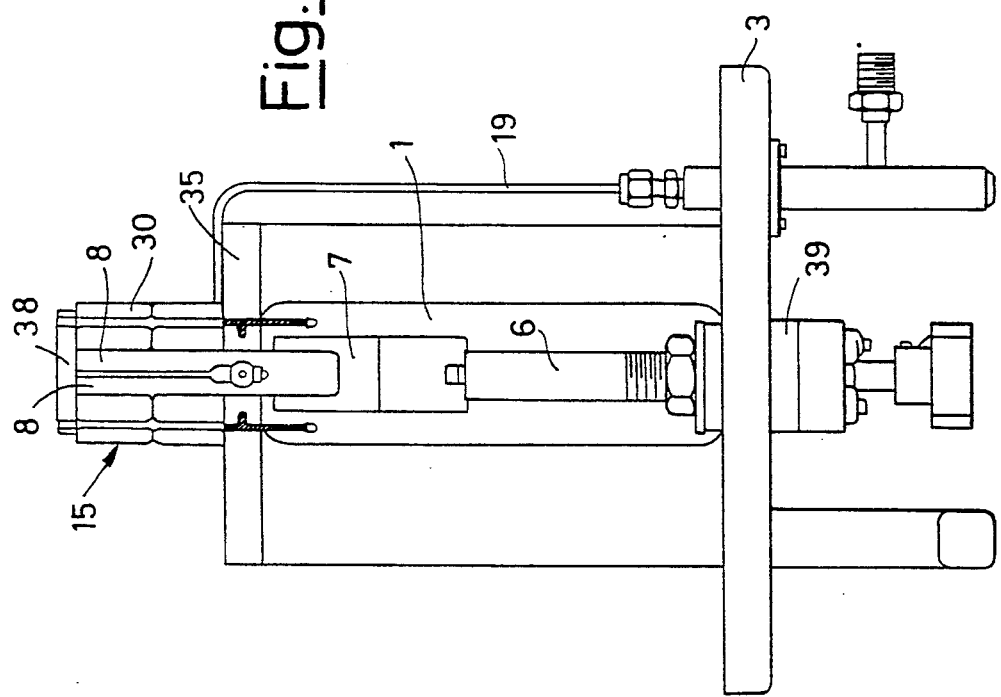
FIG. 2 is a side view of the device, from the left hand side with respect to FIG. 1.

With reference to FIGS. 1 and 2, the device comprises a cylindrical casing 1 provided with an internal cavity 2 and with a flange 3 at the lower extremity. On the flange 3 there are obtained seats for a vacuum sealing ring 4. On the flange 3 there are fitted through passing insulators 39 respective electrodes 5 to which as many cylindrical copper insulators 6 are fastened. The cylindrical insulators 6 are connected in the upper part through flexible silver conductors 7 to two pairs of small steel bars 8.

On the lower base of casing 1, at the inlet to the internal cavity 2, there is a flange 10 provided with a vacuum sealing gasket 11. On this flange 10, through the interposition of a further sealing ring 12, there is an electrode 13 welded on a passing insulator 14. On this electrode 13, on the inner part of casing 1, there is screwed on a rod 9 which passes through the entire internal cavity 2 and, through a ceramic insulator 18, the upper base of casing 1, and supports, ending with an internally threaded hollow upper extremity in which a threaded extension tang 23 is screwed, on which there is fastened with a grub screw 42, the metal to be ionized. The latter typically has the dimensions of 20×6×2 mm to optimise the efficiency of the sputtering effect. On the upper base 35 of casing 1 there is superimposed an arc chamber 15 comprising a casing 30 in the shape of a rectangular parallelepiped and an internal space 31 closed at its top end by a cover 38 provided with an aperture 36. On the lower wall of chamber 15, as shown in FIG. 3, there is inserted a ceramic insulator 16 for the passage of the support 23 and a bush 22 for the passage of an inlet line 19 of the gas to be ionized in the arc chamber 15.

Figure 3:
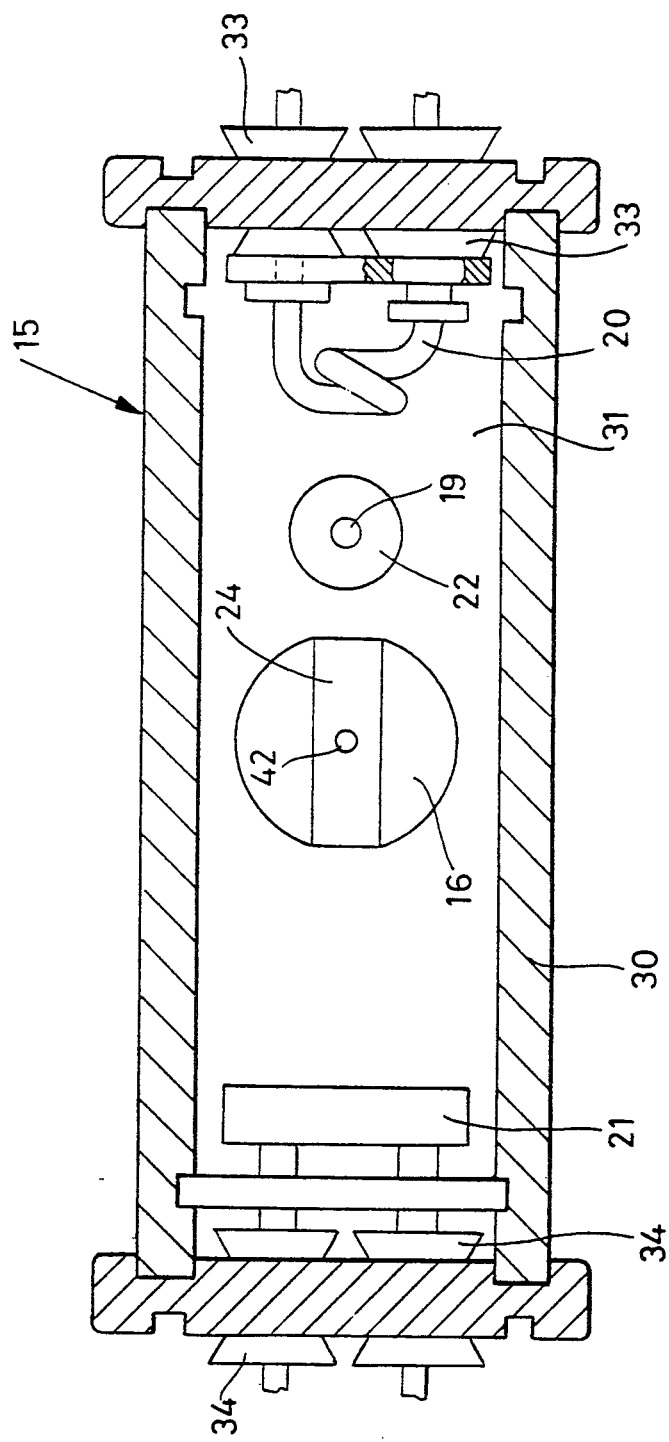
FIG. 3 is a top plan sectional view of the arc chamber.

With reference to FIG. 3, in the internal space 31, on a lateral wall of the arc chamber 15, there is a tungsten filament 20 from which electrons are emitted due to the thermoionic effect. Such a filament, passing through ceramic insulators 33, is connected to a first pair of small bars 8 and then, through corresponding conductors 7, 6, to a pair of electrodes 5. In a similar manner in the internal space 31, on the opposite lateral wall of the arc chamber 15, there is an electron repeller plate 21 which, being maintained at a negative potential through insulators 34 by the second pair of small bars 8 and corresponding conductors 7,6 up to a pair of electrodes 5, repels the electrons emitted by the tungsten filament 20 and concentrates them in the area of the internal space 31 above the outlet hole of the gas line 19. The metal to be ionized 24 with its corresponding support 23 is placed in the arc chamber 15, at its centre and under the aperture 36 of the cover 38.

With reference to the figures mentioned above the device operates in the following manner: the tungsten filament 20 carries a current having a high intensity, typically 200 A, which heats it due to the Joule effect and causes it to generate, due to the thermoionic effect, an intense electron emission.

The electron repeller plate 21 is taken to and maintained at a negative potential; the casing 30 is maintained at a positive potential with respect to the filament 20 (about 100 V) and positive with respect to the plate 21, so that the electrons emitted by the filament are accelerated towards the walls of the casing 30 itself.

In the internal space of the arc chamber there is introduced a noble gas (argon) through the inlet line 19, for the formation of the ionized plasma.

The atoms of gas are ionized by the electrons emitted by the filament 20 which, being endowed with a certain energy due to the potential existing between the walls of the casing 30 and the filament itself, collide with the molecules of gas and ionize them, causing them to assume a positive charge.

The electron repeller plate 21 is used to concentrate the electrons in the inlet area of the gas into the internal space 31, so as to increase the number of ionized molecules of the gas.

Once there has been formed inside the space 31 a plasma of argon ions, the support 23 of the metal having a high melting point to be ionized 24 is biased negatively (500-1000 V) through electrode 13. The positive ions contained in the plasma produced by the interaction between the electrons emitted by the filament 20 and the atoms of gas introduced through the line 19 are thus accelerated towards the metal 24, so as to cause, due to the exchange of the quantity of motion, the extraction or sputtering of atoms of the metal itself. These atoms are in turn ionized by the electrons emitted by the filament 20, in turn accelerated towards the walls of the casing 30. The positive ions of metal which have been formed in this way are then extracted from the arc chamber through the aperture 36 of the cover 38, thanks to the negative extraction potential applied between the walls 30 of the chamber itself and ground, to be accelerated and lastly implanted into the semiconductor to be doped.

We claim:

1. An ion implanter using a Freeman-type ion source, comprising:
    a cylindrical casing provided with an internal cavity having a longitudinal axis,
    an arc chamber superimposed over said cylindrical casing and having an external casing held at a positive voltage,
    an electrical filament housed in said arc chamber and connected to an electrical current supply,
    a repeller plate housed in said arc chamber in front of said filament and held at a first negative voltage with respect to the external casing of said arc chamber,
    a gas inlet for feeding an ionizable gas into said chamber and,
    a support for a metal to be ionized which is housed in said arc chamber in a location intermediate between said filament and said repeller plate and out of the electron flow emerging from the filament and is electrically connected to an electrode held at a second negative voltage lower than said first negative voltage.

2. An ion implanter according to claim 1, wherein said second negative voltage has a value ranging from 500 to 1000 Volts.

3. An ion implanter according to claim 1, wherein said support is fixed to an upper end of a vertical rod axially extending along said internal cavity of said cylindrical casing and having a lower end fixed to said electrode.

4. An ion implanter according to claim 3, wherein said internal cavity is closed by upper and lower end flanges provided with respective upper and lower insulators passed through by said rod.

* * * * *